United States Patent
Lu et al.

(10) Patent No.: US 10,553,533 B2
(45) Date of Patent: Feb. 4, 2020

(54) INTEGRATED FAN-OUT PACKAGE AND MANUFACTURING METHOD THEREOF

(71) Applicant: Taiwan Semiconductor Manufacturing Co., Ltd., Hsinchu (TW)

(72) Inventors: Chun-Lin Lu, Hsinchu (TW); Han-Ping Pu, Taichung (TW); Kai-Chiang Wu, Hsinchu (TW); Nan-Chin Chuang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/965,978

(22) Filed: Apr. 30, 2018

(65) Prior Publication Data

US 2019/0139890 A1 May 9, 2019

Related U.S. Application Data

(60) Provisional application No. 62/582,964, filed on Nov. 8, 2017.

(51) Int. Cl.
*H01L 23/522* (2006.01)
*H01L 23/498* (2006.01)
*H01L 23/528* (2006.01)
*H01L 23/00* (2006.01)

(52) U.S. Cl.
CPC .... *H01L 23/5226* (2013.01); *H01L 23/49816* (2013.01); *H01L 23/528* (2013.01); *H01L 24/32* (2013.01); *H01L 2924/15174* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |

(Continued)

*Primary Examiner* — Bilkis Jahan
(74) *Attorney, Agent, or Firm* — JCIPRNET

(57) ABSTRACT

An integrated fan-out (InFO) package includes a first redistribution structure, a die, an encapsulant, a plurality of first through interlayer vias (TIV), a second redistribution structure, an insulating layer, a supporting layer, and a plurality of conductive patches. The die is disposed on the first redistribution structure. The encapsulant encapsulates the die. The first TIVs are embedded in the encapsulant. The second redistribution structure is disposed on the die, the first TIVs, and the encapsulant. The first redistribution structure is electrically connected to the second redistribution structure through the first TIVs. The insulating layer is disposed on the first redistribution structure opposite to the die and includes a plurality of air gaps. The supporting layer is over the insulating layer. The conductive patches are over the supporting layer. Locations of the conductive patches correspond to locations of the air gaps of the insulating layer.

20 Claims, 14 Drawing Sheets

(56) References Cited

U.S. PATENT DOCUMENTS

| | | |
|---|---|---|
| 9,372,206 B2 | 6/2016 | Wu et al. |
| 9,496,189 B2 | 11/2016 | Yu et al. |
| 2004/0097065 A1* | 5/2004 | Lur .................... H01L 21/7682 |
| | | 438/619 |
| 2012/0211885 A1* | 8/2012 | Choi ................... H01L 23/3128 |
| | | 257/737 |
| 2013/0161826 A1* | 6/2013 | Son ....................... H01L 23/481 |
| | | 257/774 |
| 2015/0262929 A1* | 9/2015 | Hsiao ............... H01L 21/76877 |
| | | 257/773 |

\* cited by examiner

INTEGRATED FAN-OUT PACKAGE AND MANUFACTURING METHOD THEREOF

CROSS-REFERENCE TO RELATED APPLICATION

This application claims the priority benefit of U.S. provisional application Ser. No. 62/582,964, filed on Nov. 8, 2017. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
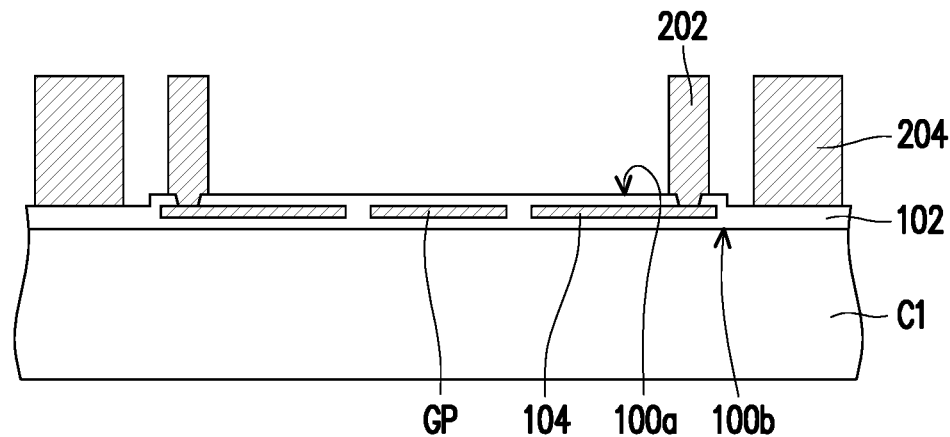
FIG. 1A to FIG. 1J are schematic cross-sectional views illustrating a manufacturing process of an integrated fan-out (InFO) package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views illustrating a manufacturing process of an integrated fan-out (InFO) package 10 in accordance with some embodiments of the disclosure. Referring to FIG. 1A, a carrier C1 is provided. In some embodiments, the carrier C1 is a glass substrate. Subsequently, a first redistribution structure 100 is formed over the carrier C1. In some embodiments, the first redistribution structure 100 includes a first dielectric layer 102, a ground plane GP, and plurality of first conductive patterns 104. The first redistribution structure 100 has a first surface 100a and a second surface 100b opposite to the first surface 100a. At this stage, the first surface 100a faces upward while the second surface 100b faces the carrier C1. In some embodiments, a de-bonding layer (not shown) may be provided between the first dielectric layer 102 and the carrier C1. The de-bonding layer may be a light-to-heat conversion (LTHC) release layer and may aid the removal of the carrier C1 in the subsequent processes. In some embodiments, the first redistribution structure 100 may be referred to as a backside redistribution structure.

In some embodiments, the first dielectric layer 102 may be a polymer layer made of polybenzoxazole (PBO), polyimide (PI), benzocyclobutene (BCB), a combination thereof, or the like. In some embodiments, the first dielectric layer 102 may include multiple dielectric layers. For example, the first redistribution structure 100 may be configured such that the ground plane GP and the first conductive patterns 104 are sandwiched between two adjacent dielectric layers of the first dielectric layer 102. That is, the ground plane GP and the first conductive patterns 104 may be considered as being embedded in the first dielectric layer 102. In some embodiments, the ground plane GP may be electrically connected to a ground. On the other hand, the first conductive patterns 104 may be electrically connected to other subsequently formed conductive elements for signal transmission. The ground plane GP and the first conductive patterns 104 may be formed by a same photolithography and etching process at the same time. In other words, in some embodiments, the ground plane GP and the first conductive patterns 104 may be collectively referred to as a first conductive pattern layer. In some embodiments, the ground plane GP and the first conductive patterns 104 includes copper, nickel, titanium, a combination thereof, or the like. It should be noted that the number of the dielectric layers (the first dielectric layer 102) and/or the first conductive pattern layer (i.e. the ground plane GP and the first conductive patterns 104) is not limited by the illustration presented in FIG. 1A. In some alternative embodiments, more dielectric layers and/or more conductive pattern layers may be formed to stack alternately.

A plurality of first through interlayer vias (TIV) 202 and a plurality of second TIVs 204 are formed over the first redistribution structure 100. As illustrated in FIG. 1A, the first TIVs 202 are electrically connected to the first conductive patterns 104 and the second TIVs 204 are electrically insulated from the first conductive patterns 104 and the ground plane GP. In some embodiments, the method of forming the first TIVs 202 includes the following steps. First, the first dielectric layer 102 is patterned to form a plurality of openings exposing at least a portion of the first conductive patterns 104. Subsequently, a seed material layer (not shown) is formed over the first dielectric layer 102 and over the first conductive patterns 104 exposed by the openings. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed TIVs. Afterwards, a plating process is performed to form a metal material layer (e.g., a copper layer) on the seed material layer exposed by the openings of the photoresist layer. The photoresist layer and the underlying seed material layer are then removed to form the first TIVs 202. In some embodiments, the second TIVs 204 may be formed by the foregoing steps as well. However, the disclosure is not limited thereto. In some alternative embodiments, the second TIVs 204 may be formed by pick and place pre-fabricated TIVs onto the first dielectric layer 102. In some embodiments, the second TIVs 204 are arranged to form a plurality of dipole antennas. As illustrated in FIG. 1A, the second TIVs 204 have a dimension (e.g. width) greater than that of the first TIVs 202. However, the disclosure is not limited thereto. In some alternative embodiments, the second TIVs 204 may have a dimension (e.g. width) substantially equal to or less than that of the first TIVs 202. It should be noted that in some embodiments, the second TIVs 204 are optional in the InFO package 10.

Figure 1B:
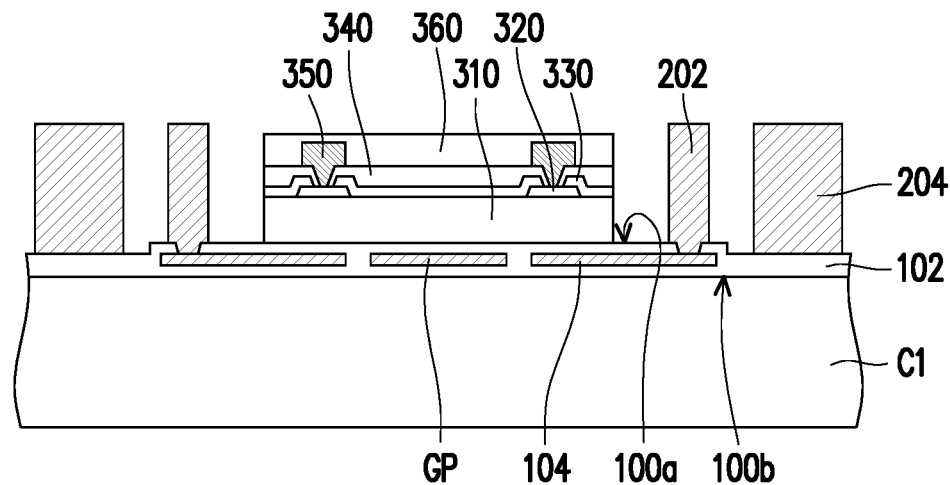

Referring to FIG. 1B, a die 300 (or integrated circuit components) may be picked and placed onto the first surface 100a of the first redistribution structure 100. The die 300, for example, includes a semiconductor substrate 310, a plurality of conductive pads 320, a passivation layer 330, a post passivation layer 340, a plurality of conductive vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a PI layer, a PBO layer, or a dielectric layer formed by other suitable polymers. In addition, the conductive vias 350 are formed on the conductive pads 320. In some embodiments, the conductive vias 350 are plated on the conductive pads 320. The protection layer 360 is formed on the post-passivation layer 340 so as to cover the conductive vias 350.

In some embodiments, the die 300 is attached (or adhered) on the first dielectric layer 102 through a die attach film (DAF; not shown). In some embodiments, one or more die(s) 300 may be picked and placed onto the first dielectric layer 102 after the formation of the first TIVs 202 and/or the second TIVs 204. However, the disclosure is not limited thereto. In some alternative embodiments, one or more die(s) 300 may be picked and placed onto the first dielectric layer 102 before the formation of the first TIVs 202 and/or the second TIVs 204.

Figure 1C:
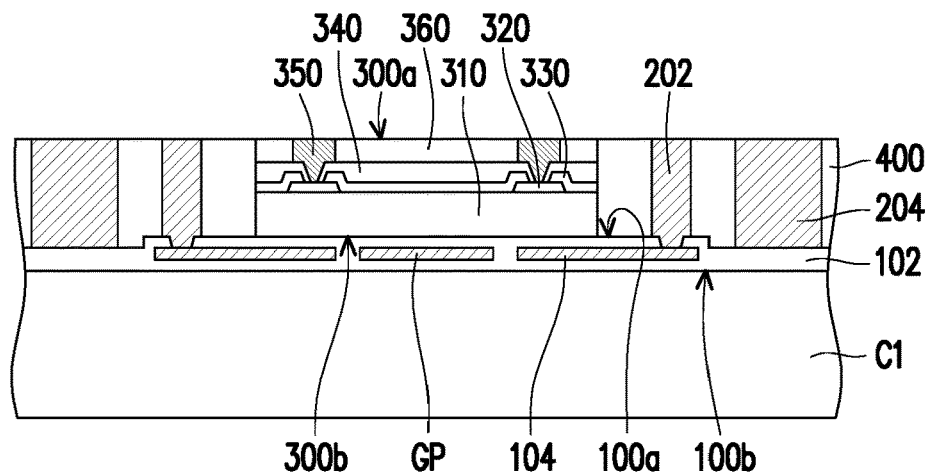

Referring to FIG. 1C, an encapsulant 400 is formed over the first surface 100a of the first redistribution structure 100 to encapsulate the die 300, the first TIVs 202, and the second TIVs 204. In other words, the die 300, the first TIVs 202, and the second TIVs 204 are embedded in the encapsulant 400. In some embodiments, the encapsulant 400 includes a molding compound, a molding underfill, a resin (such as epoxy), or the like. In some alternative embodiments, the encapsulant 400 includes a photo-sensitive material such as PBO, PI, BCB, a combination thereof, or the like. In some embodiments, a method of forming the encapsulant 400 includes the following steps. First, an encapsulation material (not shown) is formed on the first dielectric layer 102 through, for example, a compression molding process. The die 300, the first TIVs 202, the second TIVs 204, the conductive vias 350, and the protection layer 360 are encapsulated by the encapsulation material. In other words, the conductive vias 350 and the protection layer 360 of the die 300 are not revealed and are well protected by the encapsulation material. Thereafter, the encapsulation material is grinded until top surfaces of the conductive vias 350, top surfaces of the first TIVs 202, and top surfaces of the second TIVs 204 are exposed, so as to form the encapsulant 400. In some embodiments, the encapsulant material is grinded by a mechanical grinding process and/or a chemical mechanical polishing (CMP) process. In some embodiments, during the grinding process of the encapsulant material, the protection layer 360 is grinded to reveal the conductive vias 350. In some embodiments, portions of the first TIVs 202, portions of the second TIVs 204, and portions of the conductive vias 350 are slightly grinded also. After grinding, the die 300 has an active surface 300a and a rear surface 300b opposite to the active surface 300a. The exposed portion of the conductive vias 350 is located on the active surface 300a of the die 300. On the other hand, the ground plane GP and part of the first conductive patterns 104 are located over the rear surface 300b of the die 300.

Figure 1D:
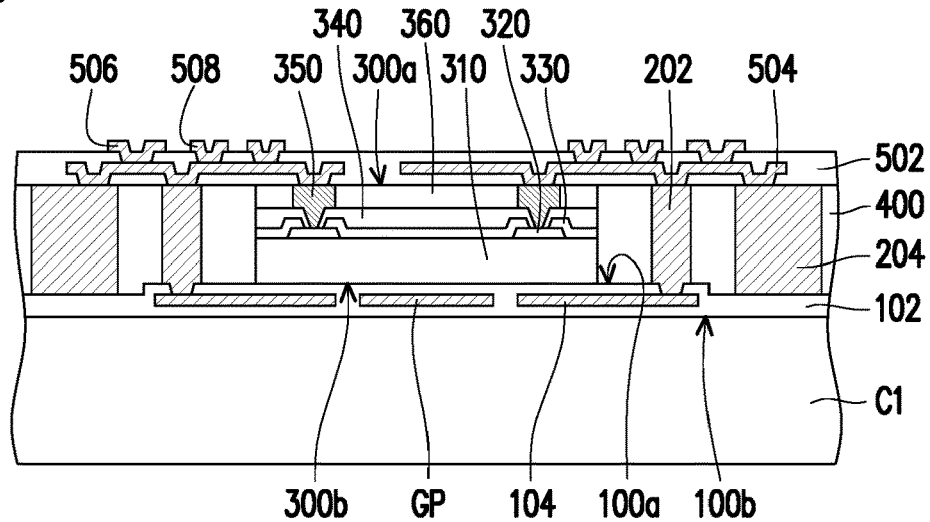

Referring to FIG. 1D, a second redistribution structure 500 is formed on the die 300, the first TIVs 202, the second TIVs 204, and the encapsulant 400. As illustrated in FIG. 1D, the active surface 300a of the die 300 faces the second redistribution structure 500. In other words, the second redistribution structure 500 is disposed on the active surface 300a of the die 300. In some embodiments, the second redistribution structure 500 includes a second dielectric layer 502, a plurality of second conductive patterns 504, a plurality of under-ball metallurgy (UBM) patterns 506, and a plurality of connection pads 508. Similar to the first dielectric layer 102, the second dielectric layer 502 may also include multiple dielectric layers. A material of the second dielectric layer 502 is similar to that of the first dielectric layer 102, so the detailed description thereof is omitted herein. Similarly, the second conductive patterns 504, the UBM patterns 506, and the connection pads 508 may include the same material as that of the ground plane GP and the first conductive patterns 104, so the detailed descriptions thereof are also omitted herein. The second conductive patterns 504 are electrically connected to the conductive vias 350 of the die 300, the first TIVs 202, and the second TIVs 204. In other words, the first TIVs 202 electrically connect the first redistribution structure 100 and the second redistribution structure 500. On the other hand, the second TIVs 204 are electrically connected to the second redistribution structure 500. In some embodiments, the second conductive patterns 504, the UBM patterns 506, and the connection pads 508 may be collectively referred to as a second conductive pattern layer. The UBM patterns 506 and the connection pads 508 are the topmost conductive patterns in the second conductive pattern layer. For example, the UBM patterns 506 and the connection pads 508 may protrude from the second dielectric layer 502 for receiving subsequently formed component. As illustrated in FIG. 1D, the second redistribution structure 500 may be configured such that the dielectric layer (i.e. the dielectric layer(s) in the second dielectric layer 502) and the second conductive pattern layer (i.e. the second conductive patterns 504, the UBM patterns 506, and the connection pads 508) are stacked in an alternate manner. In some embodiments, the second redistribution structure 500 may be referred to as a front-side redistribution structure.

In some embodiments, the signal output from the die 300 may be transmitted through portions of the second conductive patterns 504, the first TIVs 202, and the first conductive patterns 104 in sequential order. That is, in some embodiments, portions of the second conductive patterns 504, the first TIVs 202, and the first conductive patterns 104 may be collectively referred to as a feed line. As illustrated in FIG. 1D, a portion of the feed line (the first conductive patterns 104) is disposed over the rear surface 300b of the die and another portion of the feed line (the first TIVs 202) penetrates through the encapsulant 400. On the other hand, the second redistribution structure 500 is electrically connected to the feed line. It should be noted that the number of the dielectric layers (the second dielectric layer 502) and/or the second conductive pattern layer (i.e. the second conductive patterns 504, the UBM patterns 506, and the connection pads 508) is not limited by the illustration presented in FIG. 1D. In some alternative embodiments, more dielectric layers and/or more conductive pattern layers may be formed to stack alternately.

Figure 1E:
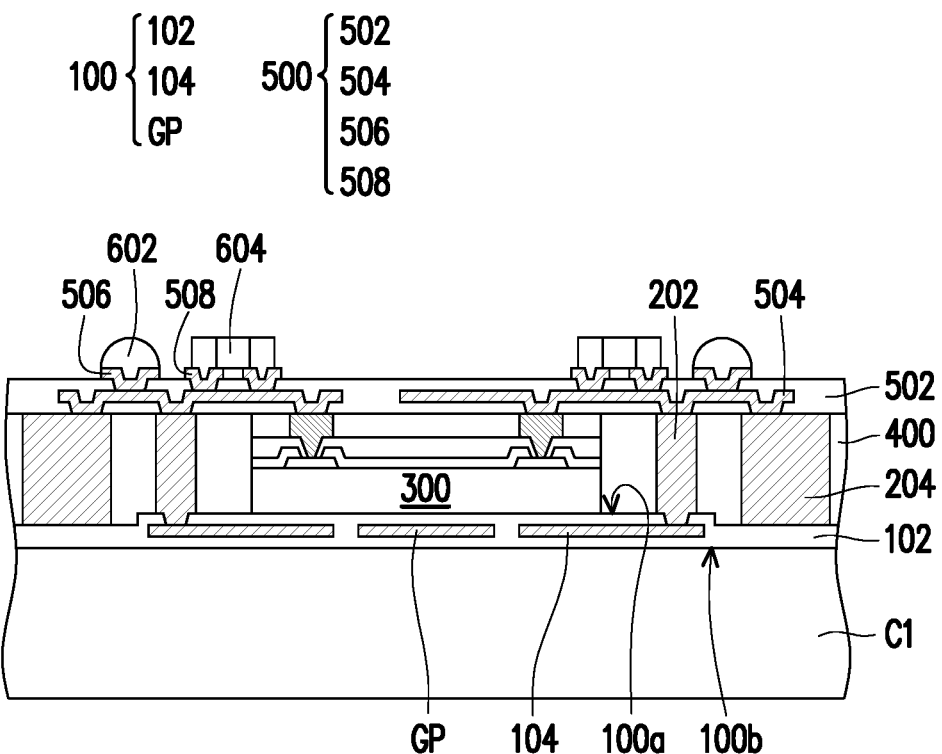

Referring to FIG. 1E, a plurality of conductive terminals 602 and a plurality of passive components 604 are formed on the second redistribution structure 500. In some embodiments, the conductive terminals 602 are attached to the UBM patterns 506 through a solder flux (not shown). In some embodiments, the conductive terminals 600 are, for example, solder balls, ball grid array (BGA) balls, or C4 bumps. In some embodiments, the conductive terminals 602 are made of a conductive material with low resistivity, such as Sn, Pb, Ag, Cu, Ni, Bi, or an alloy thereof. In some embodiments, the conductive terminals 602 may be disposed on the UBM patterns 506 by a ball placement process and/or a reflow process. In some embodiments, the passive components 604 may be mounted on the connection pads 508 through a soldering process, a reflowing process, or other suitable processes. In some embodiments, the passive components 604 may include capacitors, resistors, inductors, fuses, or the like.

Figure 1F:
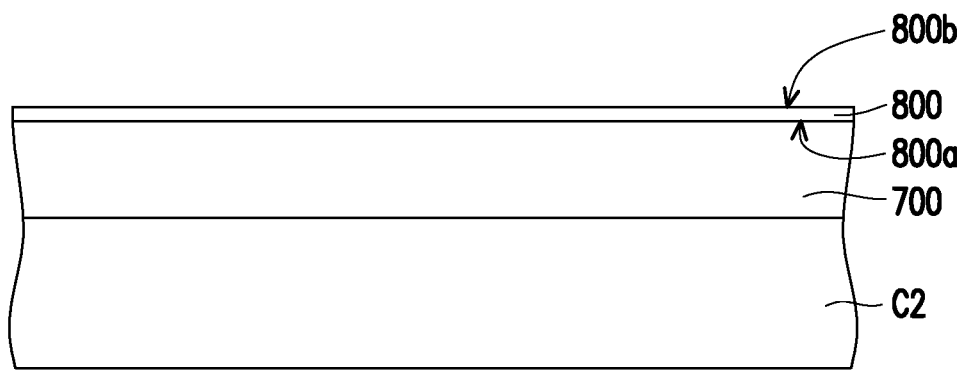
Figure 1G:
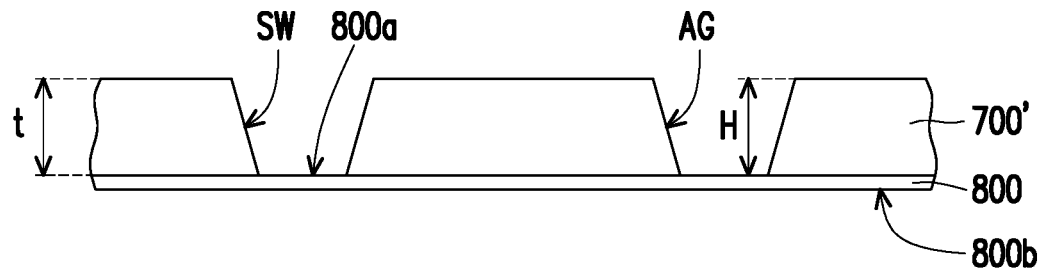

Referring to FIG. 1F and FIG. 1G, when performing the steps illustrated in FIG. 1A to FIG. 1E, the steps illustrated in FIG. 1F and FIG. 1G may be simultaneously conducted. Referring to FIG. 1F, an insulating material layer 700 and a supporting layer 800 are sequentially formed over a carrier C2. In some embodiments, the carrier C2 is a glass substrate. In some embodiments, the insulating material layer 700 is a polymer layer. For example, the insulating material layer 700 includes a photo-sensitive material such as PBO, polyimide, BCB, a combination thereof, or the like. In some alternative embodiments, the insulating material layer 700 includes epoxy resins or any other suitable type of molding materials. In some embodiments, the material of the insulating material layer 700 has a low dissipation factor (Df) and/or a low permittivity (Dk). Depending on the frequency range of high-speed applications, suitable materials of the insulating material layer 700 may be selected based on the required electrical properties of the InFO package 10. The insulating material layer 700 is formed by a suitable fabrication technique such as spin-coating, lamination, deposition or the like. In some embodiments, a thickness of the insulating material layer 700 may range between 200 µm to 2 mm. In some embodiments, a de-bonding layer (not shown) may be provided between the insulating material layer 700 and the carrier C2. The de-bonding layer may be a LTHC release layer and may aid the removal of the carrier C2 in the subsequent processes.

The supporting layer 800 has a first surface 800a and a second surface opposite 800b opposite to the first surface 800a. As illustrated in FIG. 1F, the first surface 800a of the supporting layer 800 is attached to the insulating material layer 700. In some embodiments, the supporting layer 800 includes materials having higher mechanical strength than the insulating material layer 700. For example, the supporting layer 800 may include glass or molding compound. In some embodiments, a thickness of the supporting layer 800 may range between 50 µm to 500 µm. For example, the thickness of the supporting layer 800 may be 20%-25% of the thickness of the insulating material layer 700.

Referring to FIG. 1G, the insulating material layer 700 is separated from the carrier C2. In some embodiments, the de-bonding layer (not shown) may be irradiated by UV laser such that the insulating material layer 700 is de-bonded from the carrier C2. Thereafter, the insulating material layer 700 having the supporting layer 800 attached thereto is flipped upside down. Subsequently, a portion of the insulating material layer 700 is removed to form an insulating layer 700' having a plurality of air gaps AR. In some embodiments, the portion of the insulating material layer 700 may be removed through a laser drilling process, a photolithography and etching process, or a punching process. As illustrated in FIG. 1G, the insulating material layer 700 is being processed such that the first surface 800a of the supporting layer 800 is exposed by the air gaps AG. For example, the portion of the insulating material layer 700 may be removed completely in a thickness direction of the insulating material layer 700 such that the air gaps AG penetrate through the insulating layer 700'. As a result, the thickness t of the insulating layer 700' is substantially equal to a height H of each air gap AG. In some embodiments, the sidewalls SW of the air gaps AG may form an included angle with the first surface 800a of the supporting layer 800. In some embodiments, the included angle may range between 0° and 180°. For example, the air gaps AG may be formed to have slanted sidewalls SW, as illustrated in FIG. 1G. However, the disclosure is not limited thereto. In some alternative embodiments, the air gaps AG may be formed to have straight sidewalls SW.

Figure 1H:
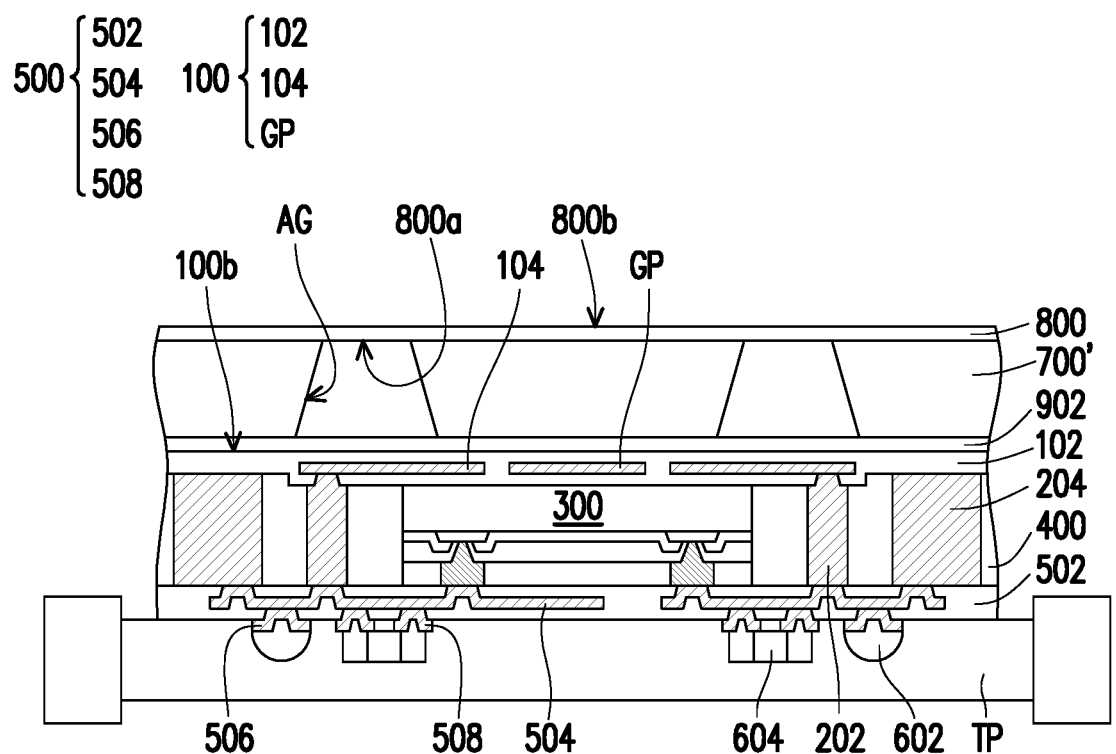

Referring to FIG. 1H, the structure illustrated in FIG. 1E is de-bonded from the carrier C1. For example, the de-bonding layer (not shown) may be irradiated by UV laser such that the first redistribution structure 100 is de-bonded from the carrier C2. The de-bonded structure is then flipped upside down and is attached to a tape TP for further processing. Thereafter, the structure illustrated in FIG. 1G is adhered to the flipped structure on the tape TP through an adhesion layer 902. As illustrated in FIG. 1H, the structure illustrated in FIG. 1G is placed such that the first surface 800a of the supporting layer 800 faces the first redistribution structure 100. For example, the insulating layer 700' is formed over the first redistribution structure 100 opposite to the die 300, and the adhesion layer 902 is sandwiched between the insulating layer 700' and the first redistribution structure 100.

Figure 1I:
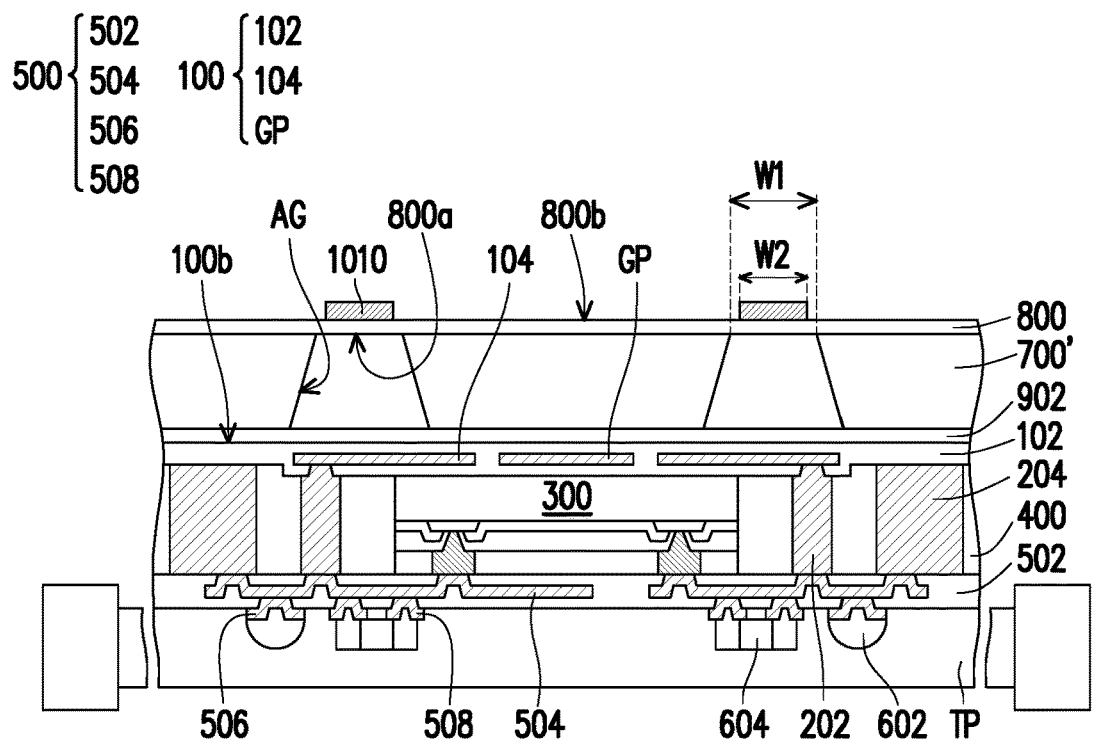
Figure 2A:
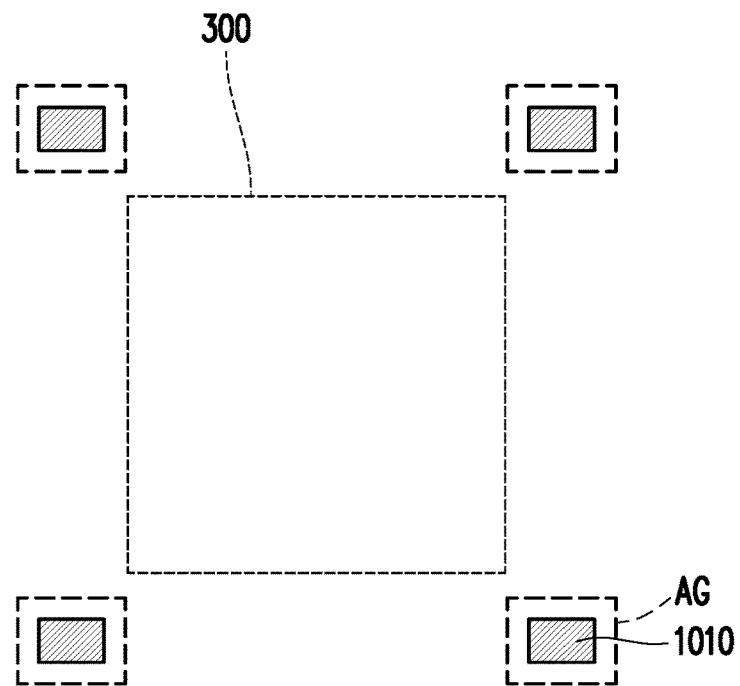
FIG. 2A is a schematic top view illustrating an InFO package in accordance with some embodiments of the disclosure.

Referring to FIG. 1I, a plurality of conductive patches 1010 are formed on the supporting layer 800. As illustrated in FIG. 1I, the conductive patches 1010 are disposed on the second surface 800b of the supporting layer 800. In some embodiments, a vertical projection of the conductive patches 1010 onto the first redistribution structure 100 in the thickness direction of the insulating layer 700' is overlapped with the corresponding air gap AG. In other words, locations of the conductive patches 1010 correspond to locations of the air gaps AG of the insulating layer 700'. For example, the air gaps AG are located directly underneath the conductive patches 1010. The relative positions of the conductive patches 1010 and the air gaps AG will be explained in conjunction with FIG. 2A. FIG. 2A is a schematic top view illustrating an InFO package 10 in accordance with some embodiments of the disclosure. For simplicity, only the die 300, the conducive patches 1010, and the air gaps AG are illustrated in FIG. 2A, and other elements presented in FIG. 1I are omitted. Referring to FIG. 2A, in some embodiments, the conductive patches 1010 and the air gaps AG are not overlapped with the die 300 (outlines shown as dotted lines) along the vertical projection from the top view. On the other hand, the conductive patches 1010 are overlapped with the air gaps AG from the top view. As illustrated in FIG. 2A, contours (shown as dash lines) of air gaps AG surround contours of the conductive patches 1010. For example, each of the conductive patches 1010 is located within the contour of the corresponding air gap AG. In some embodiments, one conductive patch 1010 corresponds to one air gap AG, as illustrated in FIG. 2A. The shape of the air gaps AG and the conductive patches 1010 are not particularly limited. From the top view, the air gaps AG and the conductive patches 1010 may be squares, rectangles, circles, ellipse, or any other suitable shape. It should be noted that the layout shown in FIG. 2A merely serve as an exemplary illustration, and the disclosure is not limited thereto. The top view of the InFO package 10 may adapt other layouts, and the detailed description thereof will be discussed in greater detail later in conjunction with FIG. 2B.

Referring back to FIG. 1I, in some embodiments, each air gap AG has a minimum width w1 and each conductive patch 1010 has a maximum width w2. As illustrated in FIG. 1I, the minimum width w1 of the air gap AG is greater than the maximum width w2 of the conductive patch 1010. However, the disclosure is not limited thereto. In some alternative embodiments, the minimum width w1 of the air gap AG is equal to the maximum width w2 of the conductive patch 1010. However, the minimum width w1 of the air gap AG is not smaller than the maximum width w2 of the conductive patch 1010. In some embodiments, the conductive patches 1010 may be electrically coupled to the first conductive patterns 104 (portions of the feed line) of the first redistribution structure 100. In other words, the signal transmitted in the first conductive patterns 104 may be electrically coupled to the conductive patches 1010 such that the conductive patches 1010 may be referred to as patch antennas. In some embodiments, the conductive patches 1010 are formed by forming a metallization layer (not shown) through electroplating or deposition over the supporting layer 800 and then patterning the metallization layer by a photolithography and etching processes. In some alternative embodiments, the conductive patches 1010 may be formed by printing a plurality of metallization patterns directly onto the supporting layer 800. For example, metallic paste may be printed onto the supporting layer 800 and cured to form the conductive patches 1010. In some embodiments, a material of the conductive patches 1010 includes aluminum, titanium, copper, nickel, tungsten, and/or alloys thereof.

Figure 1J:
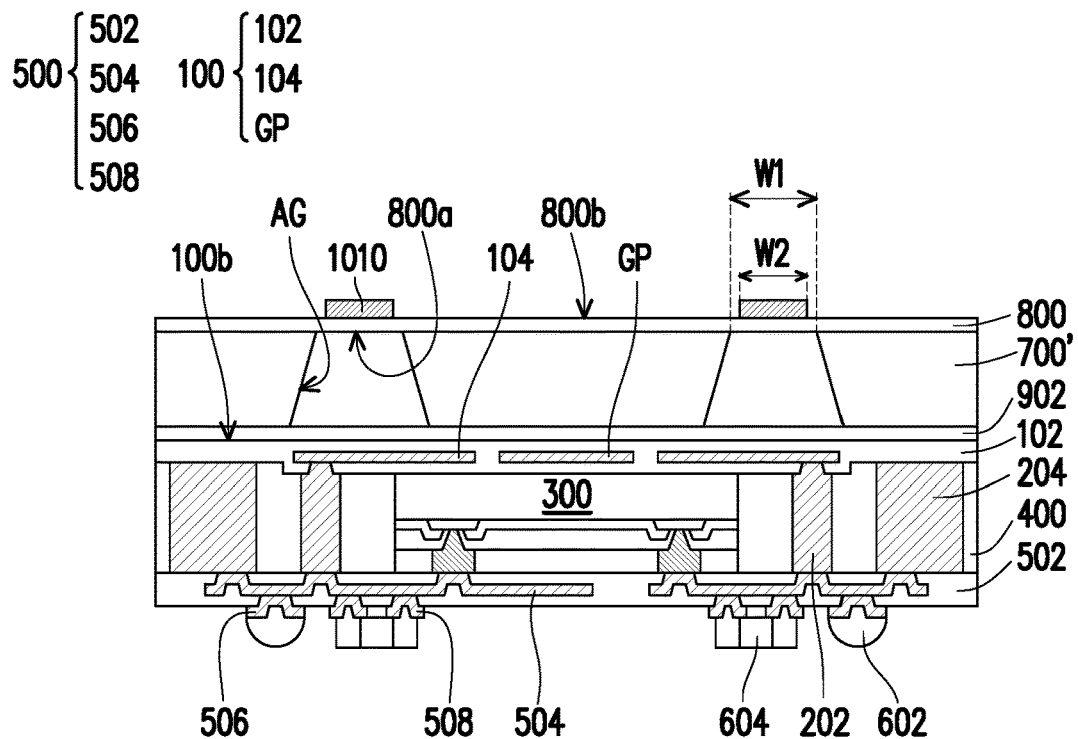

Referring to FIG. 1J, the tape TP is removed and the structure illustrated in FIG. 1I may undergo a singulation process to form the InFO package 10 illustrated in FIG. 1J. As mentioned above, the signal transmitted in the first conductive patterns 104 may be electrically coupled to the conductive patches 1010. Therefore, the properties of the medium between the first conductive patterns 104 and the conductive patches 1010 are crucial. In general, mediums having low Dk and Df are able to provide low loss transmission path. Since air has low Dk and Df values, the air gaps AG located between the first conductive patterns 104 and the conductive patches 1010 are able to provide a low loss signal transmission path, thereby allowing higher gain of the patch antenna. As a result, the antenna efficiency of the InFO package 10 may be sufficiently enhanced.

Figure 2B:
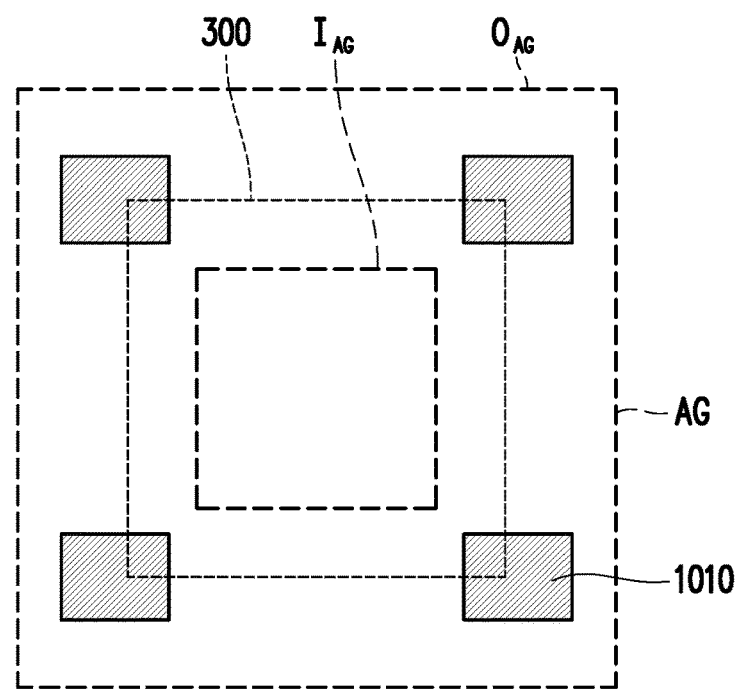
FIG. 2B is a schematic top view illustrating an InFO package in accordance with some alternative embodiments of the disclosure.

FIG. 2B is a schematic top view illustrating an InFO package 10 in accordance with some alternative embodiments of the disclosure. Similar to that of FIG. 2A, some elements in the InFO package 10 are omitted for simplicity. As mentioned above, the top view of the InFO package 10 may also adapt the layout illustrated in FIG. 2B. In some embodiments, the conductive patches 1010 are overlapped with a portion of the die 300. For example, the conductive patches 1010 may overlap with four corners of the die 300. On the other hand, the air gap AG may take the form of a ring shape. In some embodiments, multiple conductive patches 1010 correspond to one air gap AG, as illustrated in FIG. 2B. For example, the contours of multiple conductive patches 1010 are enclosed by an inner edge $I_{AG}$ (shown as dash line) of the ring-shaped air gap AG and an outer edge $O_{AG}$ (shown as dash line) of the ring-shaped air gap AG. The layout of the conductive patches 1010 and the air gaps AG are not limited as long as the locations of the conductive patches 1010 correspond to the locations of the air gaps AG.

Figure 3A:
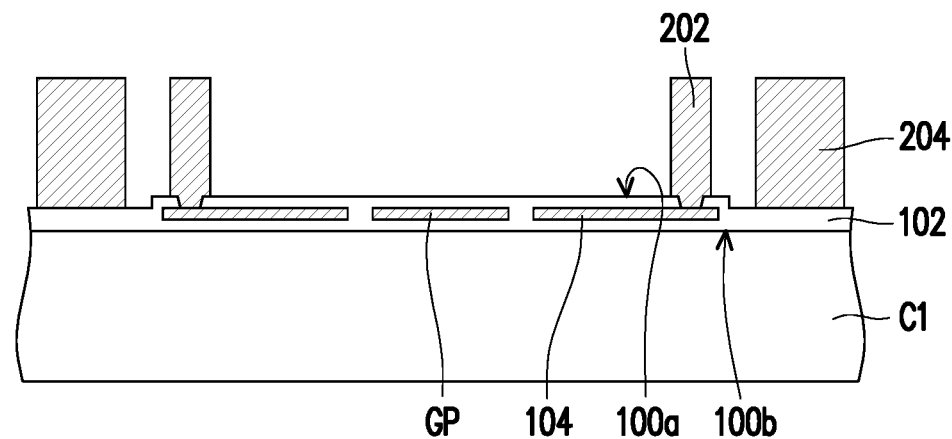
FIG. 3A to FIG. 3K are schematic cross-sectional views illustrating a manufacturing process of an InFO package in accordance with some alternative embodiments of the disclosure.
Figure 3B:
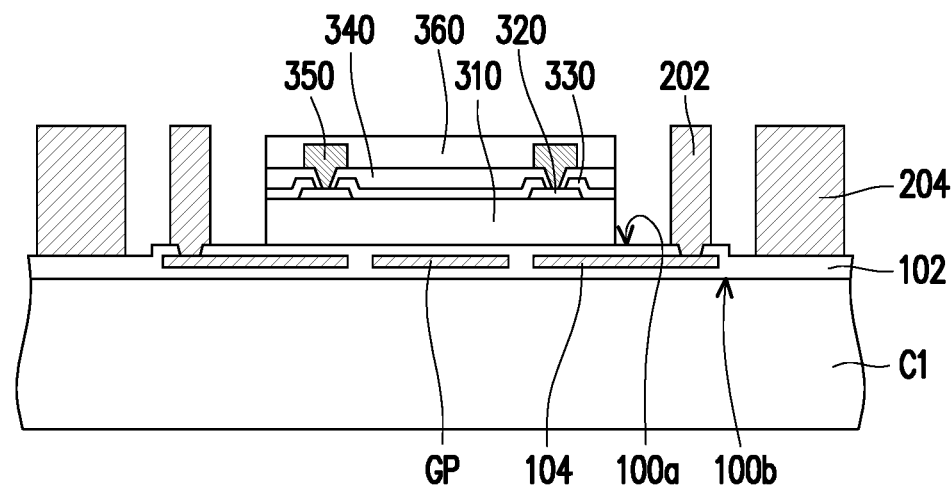
Figure 3C:
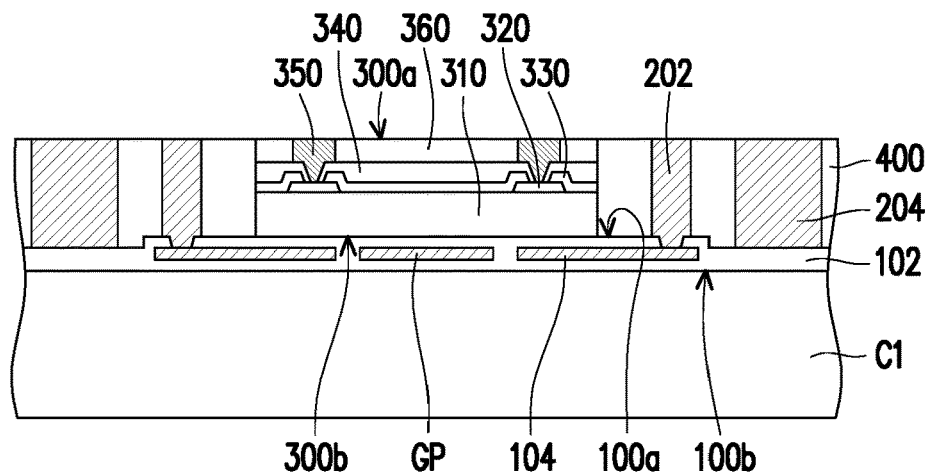
Figure 3D:
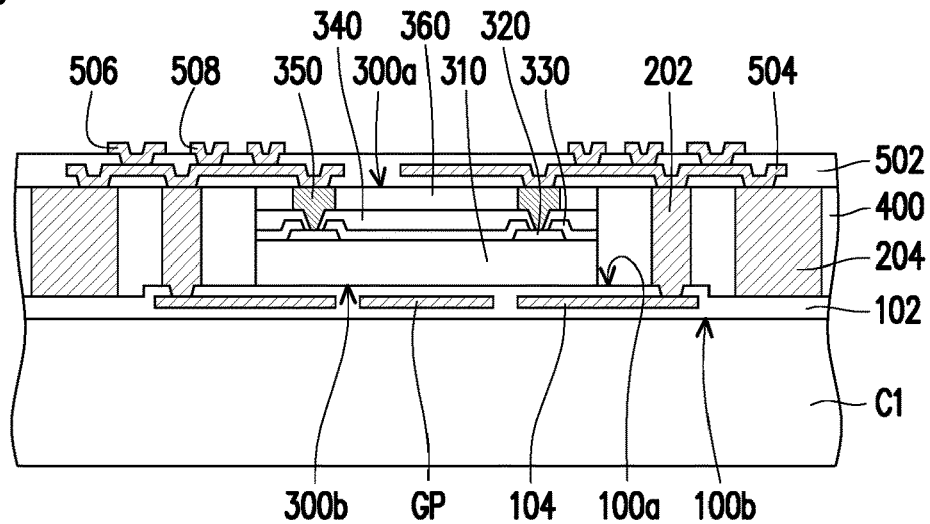
Figure 3E:
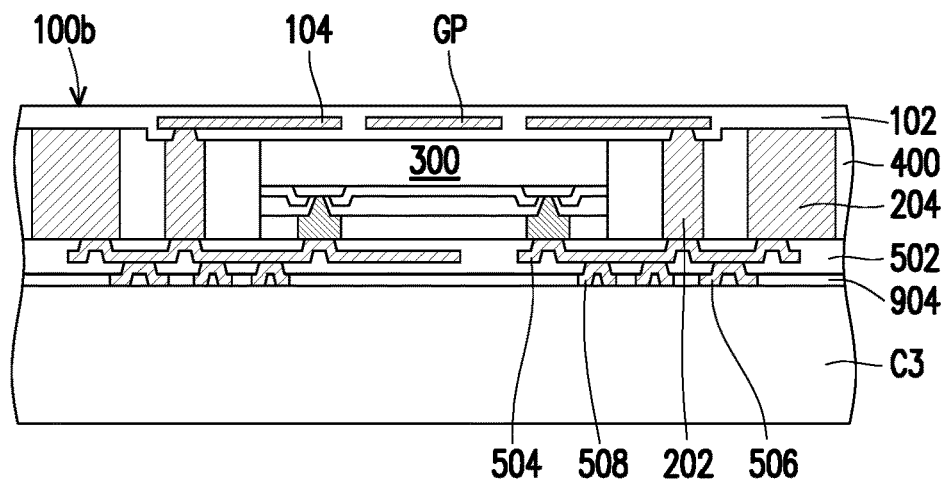

FIG. 3A to FIG. 3K are schematic cross-sectional views illustrating a manufacturing process of an InFO package 20 in accordance with some alternative embodiments of the disclosure. Referring to FIG. 3A to FIG. 3D, the steps illustrated in FIG. 3A to FIG. 3D are similar to the steps illustrated in FIG. 1A to FIG. 1D, so the detailed descriptions are omitted herein. Referring to FIG. 3E, the first redistribution structure 100 is separated from the carrier C1. In some embodiments, the de-bonding layer (not shown) may be irradiated by UV laser such that the first dielectric layer 102 is de-bonded from the carrier C1. Subsequently, the structure is flipped upside down and is attached to a carrier C3 through an adhesion layer 904.

Figure 3F:
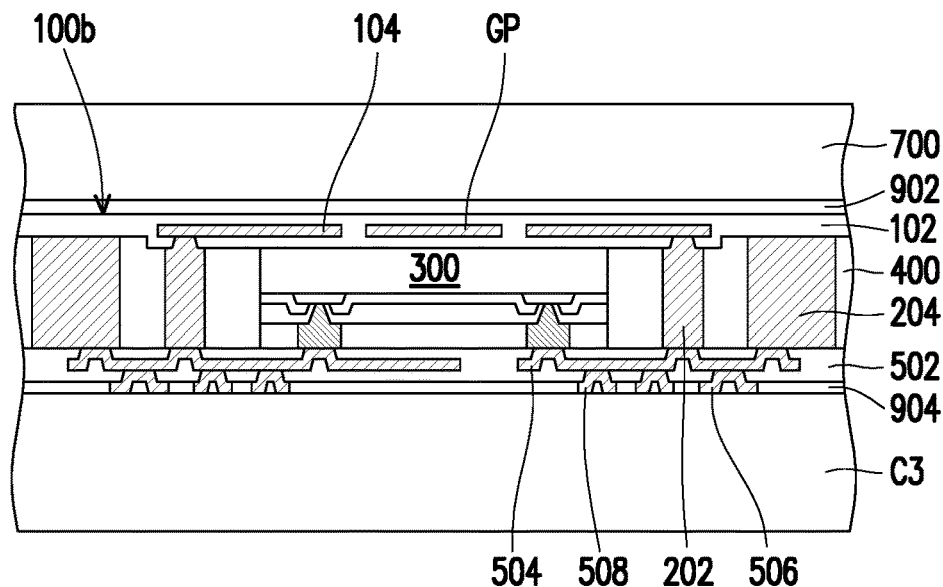

Referring to FIG. 3F, an adhesion layer 902 and an insulating material layer 700 are sequentially formed on the second surface 100b of the first redistribution structure 100. In other words, the adhesion layer 902 is formed over the first redistribution structure 100 prior to the formation of the insulating material layer 700. In some embodiments, the insulating material layer 700 is a polymer layer. For example, the insulating material layer 700 includes a photosensitive material such as PBO, polyimide, BCB, a combination thereof, or the like. In some alternative embodiments, the insulating material layer 700 includes epoxy resins or any other suitable type of molding materials. In some embodiments, the material of the insulating material layer 700 has a low Df and/or a low Dk. Depending on the frequency range of high-speed applications, suitable materials of the insulating material layer 700 may be selected based on the required electrical properties of the InFO package 20. The insulating material layer 700 is formed by a suitable fabrication technique such as spin-coating, lamination, deposition or the like. In some embodiments, a thickness of the insulating material layer 700 may range between 200 μm to 2 mm.

Figure 3G:
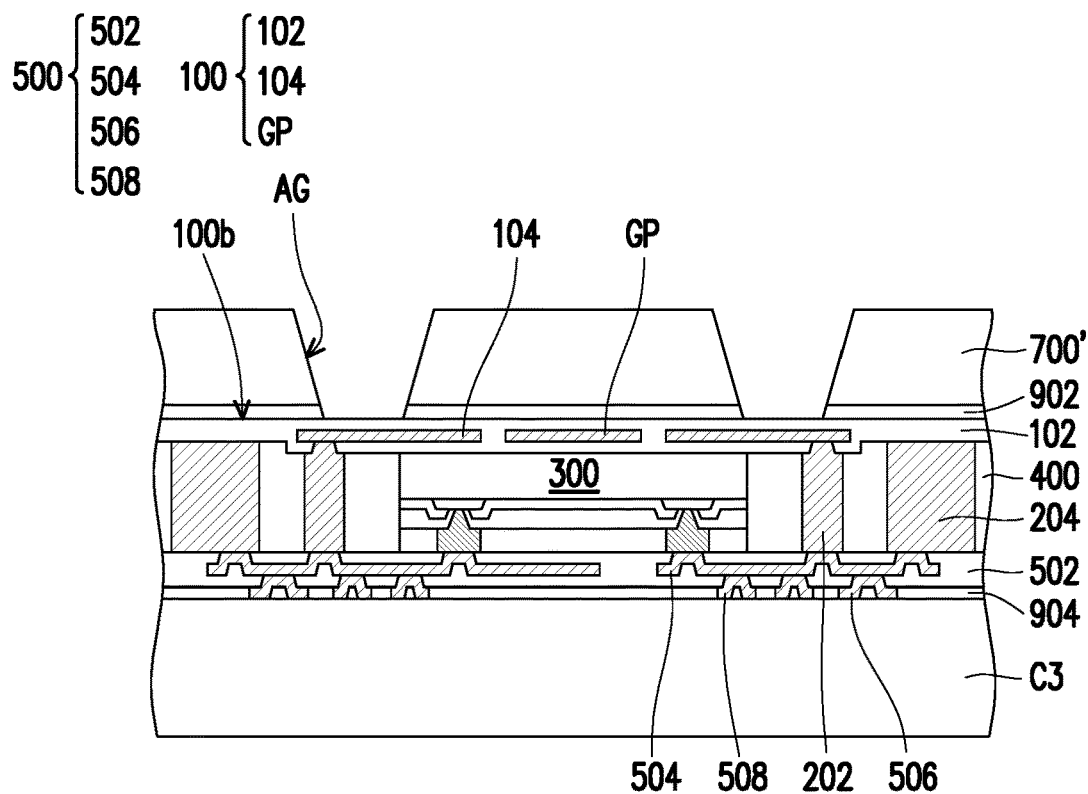

Referring to FIG. 3G, a portion of the insulating material layer 700 is removed to form an insulating layer 700' having a plurality of air gaps AR. In some embodiments, a portion of the adhesion layer 902 is also removed to expose the second surface 100b of the first redistribution structure 102. The portion of the insulating material layer 700 and the portion of the adhesion layer 902 may be removed through, for example, a laser drilling process, a photolithography and etching process, or a punching process.

Figure 3H:
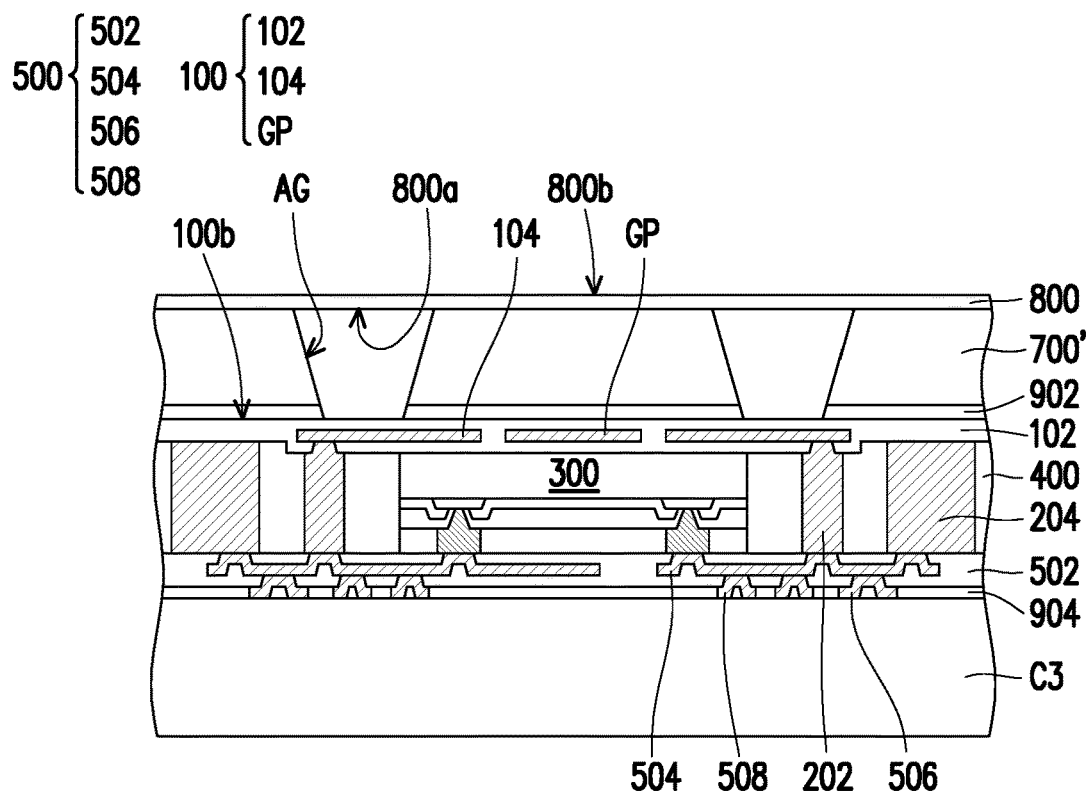

Referring to FIG. 3H, a supporting layer 800 is formed over the insulating layer 700' to seal the air gaps AR. The supporting layer 800 has a first surface 800a and a second surface 800b opposite to the first surface 800a. As illustrated in FIG. 3H, the first surface 800a of the supporting layer 800 is attached to the insulating layer 700'. In some embodiments, the supporting layer 800 includes materials having higher mechanical strength than the insulating layer 700'. For example, the supporting layer 800 may include glass or molding compound. In some embodiments, a thickness of the supporting layer 800 may range between 50 μm to 500 μm. For example, the thickness of the supporting layer 800 may be 20%-25% of the thickness of the insulating layer 700'.

Figure 3I:
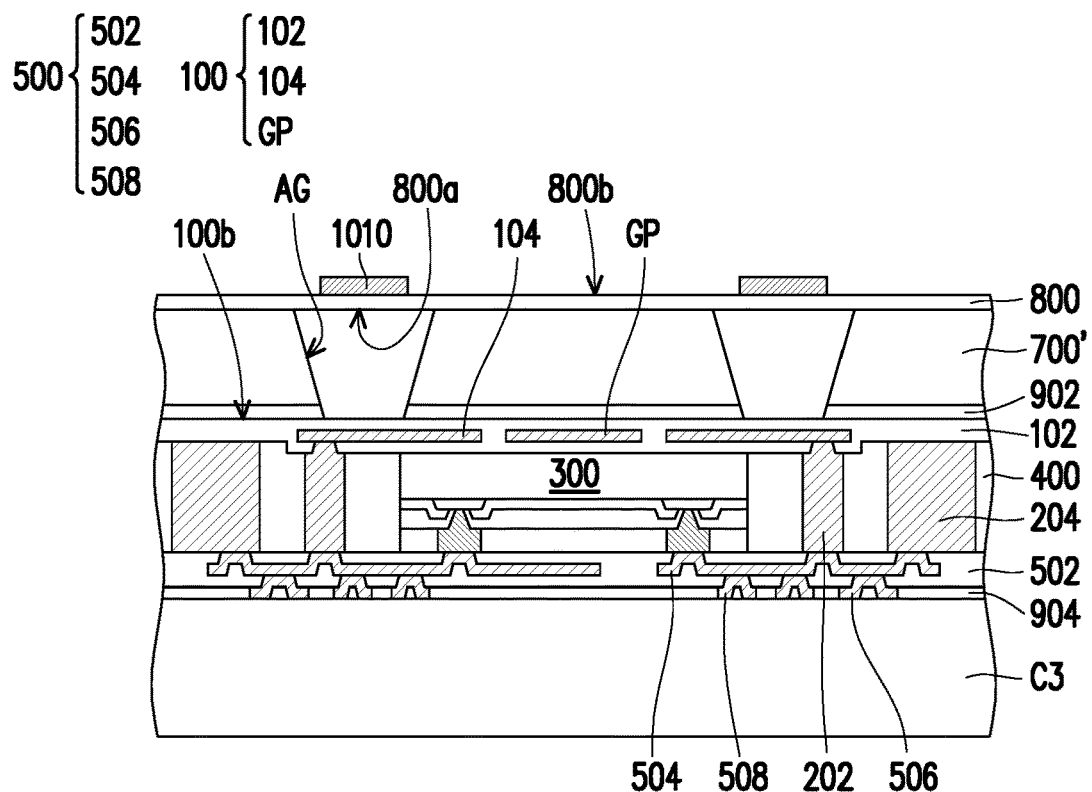

Referring to FIG. 3I, a plurality of conductive patches 1010 are formed over the supporting layer 800. The detailed descriptions with respect to the conductive patches 1010 may be referred to the descriptions related to FIG. 1I and will not be repeated herein.

Figure 3J:
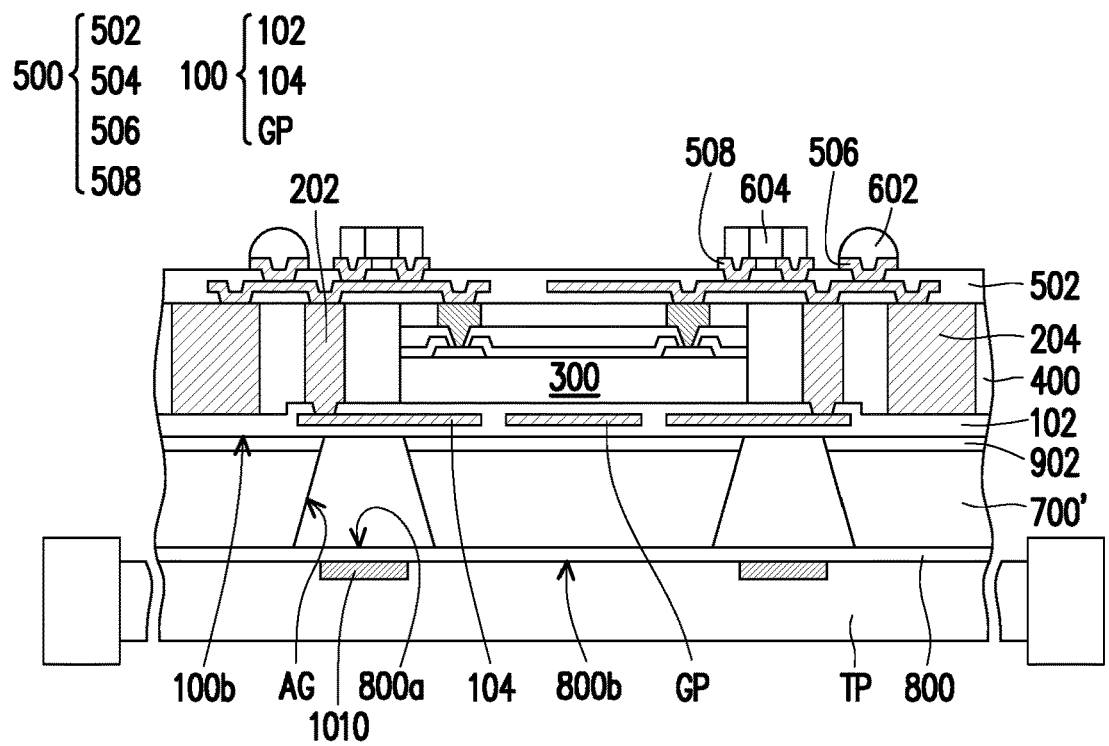

Referring to FIG. 3J, the adhesion layer 904 and the carrier C3 is separated from the second redistribution structure 500. Subsequently, the structure is flipped upside down and is attached to a tape TP for further processing. As illustrated in FIG. 3J, a plurality of conductive terminals 602 and a plurality of passive components 604 are respectively formed on the UBM patterns 506 and the connection pads 508. The detailed descriptions with respect to the UBM patterns 506 and the connection pads 508 may be referred to the descriptions related to FIG. 1E and will not be repeated herein.

Figure 3K:
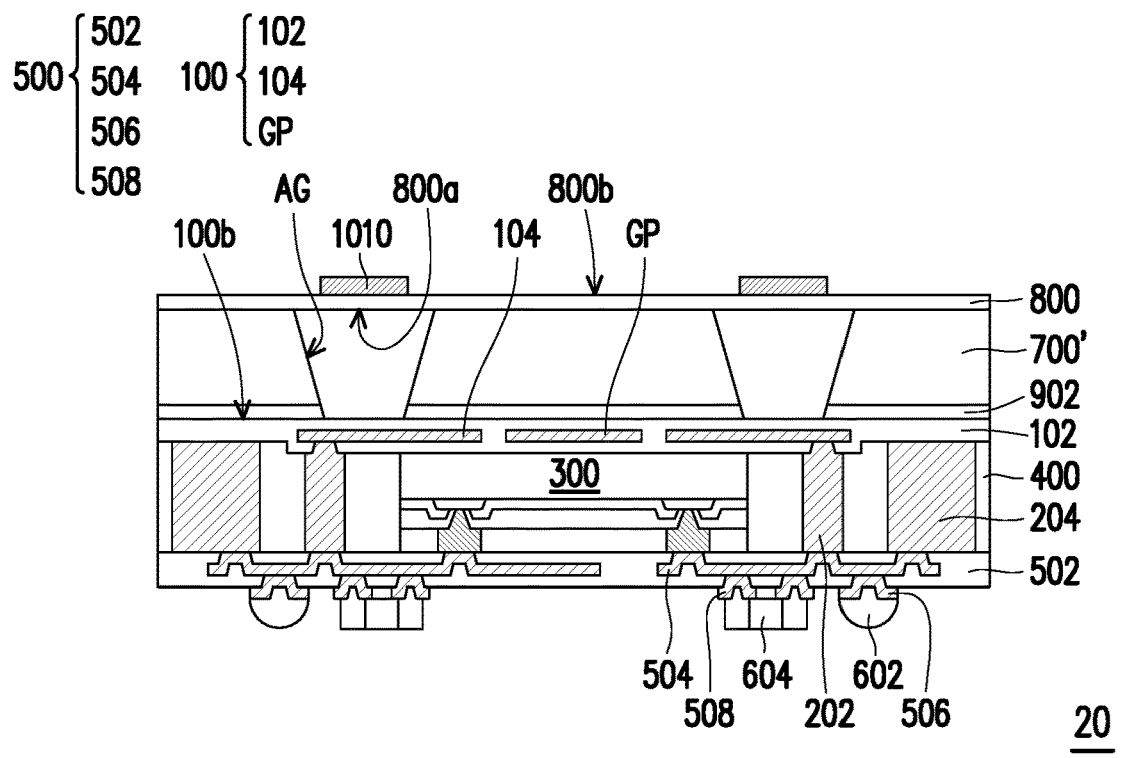

Referring to FIG. 3K, the tape TP is removed and the structure illustrated in FIG. 3J may undergo a singulation process to form the InFO package 20 illustrated in FIG. 3K. As mentioned above, the signal transmitted in the first conductive patterns 104 may be electrically coupled to the conductive patches 1010. Therefore, the properties of the medium between the first conductive patterns 104 and the conductive patches 1010 are crucial. In general, mediums having low Dk and Df are able to provide low loss transmission path. Since air has low Dk and Df values, the air gaps AG located between the first conductive patterns 104 and the conductive patches 1010 are able to provide a low loss signal transmission path, thereby allowing higher gain of the patch antenna. As a result, the antenna efficiency of the InFO package 20 may be sufficiently enhanced.

Figure 4:
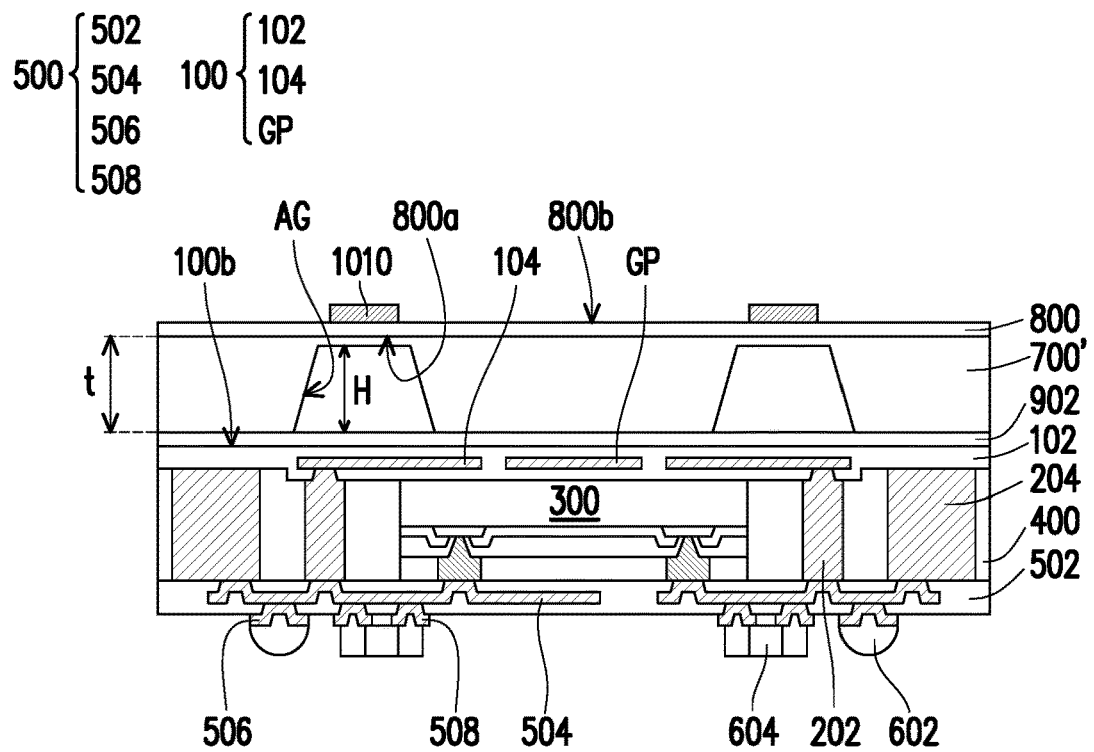
FIG. 4 is a schematic cross-sectional view illustrating an InFO package in accordance with some alternative embodiments of the disclosure.

FIG. 4 is a schematic cross-sectional view illustrating an InFO package 30 in accordance with some alternative embodiments of the disclosure. Referring to FIG. 4, the InFO package 30 illustrated in FIG. 4 may be manufactured by the steps similar to the steps illustrated in FIG. 1A to FIG. 1J. Nevertheless, during the step illustrated in FIG. 1G, the insulating material layer 700 is partially removed in the thickness direction of the insulating material layer 700 such that the air gaps AG do not penetrate through the insulating layer 700'. In other words, after the air gaps AG are formed, the first surface 800a is still well covered by the insulating layer 700'. As a result, as illustrated in FIG. 4, a height H of each air gap AG is smaller than a thickness t of the insulating layer 700'. As mentioned above, the signal transmitted in the first conductive patterns 104 may be electrically coupled to the conductive patches 1010. Therefore, the properties of the medium between the first conductive patterns 104 and the conductive patches 1010 are crucial. In general, mediums having low Dk and Df are able to provide low loss transmission path. Since air has low Dk and Df values, the air gaps AG located between the first conductive patterns 104 and the conductive patches 1010 are able to provide a low loss signal transmission path, thereby allowing higher gain of the patch antenna. As a result, the antenna efficiency of the InFO package 30 may be sufficiently enhanced.

Figure 5:
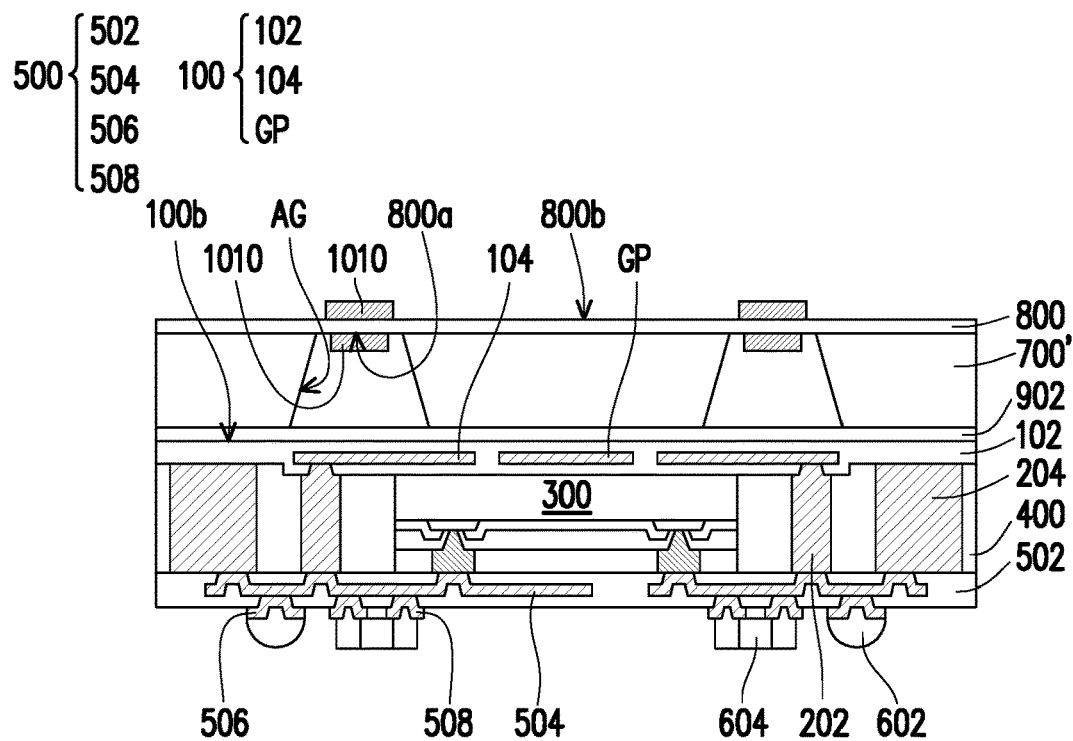
FIG. 5 is a schematic cross-sectional view illustrating an InFO package in accordance with some alternative embodiments of the disclosure.

FIG. 5 is a schematic cross-sectional view illustrating an InFO package 40 in accordance with some alternative embodiments of the disclosure. Referring to FIG. 5, the InFO package 40 illustrated in FIG. 5 may be manufactured by the steps similar to the steps illustrated in FIG. 1A to FIG. 1J. Nevertheless, during the step illustrated in FIG. 1G, after the air gaps AG are formed to expose the first surface 800a of the supporting layer 800, a plurality of conductive patches 1010 are formed on the first surface 800a of the supporting layer 800 exposed by the air gaps AG. As a result, as illustrated in FIG. 5, the conductive patches 1010 are located on both sides of the supporting layer 800. The dual-side conductive patches 1010 are able to provide a wider bandwidth and a variety of frequency bands, thereby enhancing the performance of the InFO package 40. It should be noted that although FIG. 5 illustrated that the conductive patches 1010 are located on both surfaces (the first surface 800a and the second surface 800b) of the supporting layer 800, it construes no limitation in the disclosure. In some alternative embodiments, the conductive patches 1010 located on the second surface 800b of the supporting layer 800 may be omitted. For example, all the conductive patches 1010 may be located inside the air gaps AG. As mentioned above, the signal transmitted in the first conductive patterns 104 may be electrically coupled to the conductive patches 1010. Therefore, the properties of the medium between the first conductive patterns 104 and the conductive patches 1010 are crucial. In general, mediums having low Dk and Df are able to provide low loss transmission path. Since air has low Dk and Df values, the air gaps AG located between the first conductive patterns 104 and the conductive patches 1010 are able to provide a low loss signal transmission path, thereby allowing higher gain of the patch antenna. As a result, the antenna efficiency of the InFO package 40 may be sufficiently enhanced.

Figure 6:
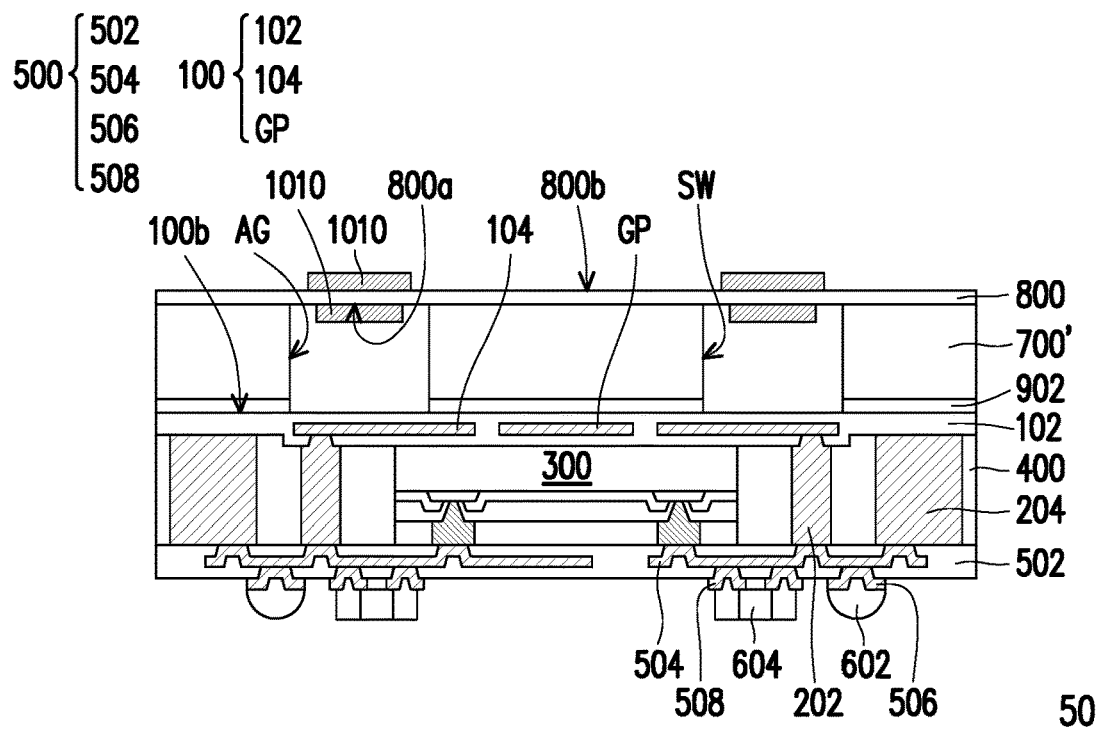
FIG. 6 is a schematic cross-sectional view illustrating an InFO package in accordance with some alternative embodiments of the disclosure.

FIG. 6 is a schematic cross-sectional view illustrating an InFO package 50 in accordance with some alternative embodiments of the disclosure. Referring to FIG. 6, the InFO package 50 illustrated in FIG. 6 may be manufactured by the steps similar to the steps illustrated in FIG. 3A to FIG. 3K. Nevertheless, during the step illustrated in FIG. 3G, the air gaps AG may be formed to have straight sidewalls SW. For example, an included angle formed between the sidewall SW of the air gaps AG and the second surface 100b of the first redistribution structure 100 may be 90°. In addition, during the step illustrated in FIG. 3H, the conductive patches 1010 may be formed on both the first surface 800a and the second surface 800b of the supporting layer 800 before the supporting layer 800 is attached onto the insulating layer 700'. As a result, as illustrated in FIG. 6, the conductive patches 1010 are located on both sides of the supporting layer 800. In some alternative embodiments, the InFO package 50 illustrated in FIG. 6 may be manufactured by the steps similar to the steps illustrated in FIG. 1A to FIG. 1J. Nevertheless, during the step illustrated in FIG. 1G, the air gaps AG may be formed to have straight sidewalls SW. In addition, after the air gaps AG are formed to expose the first surface 800a of the supporting layer 800, a plurality of conductive patches 1010 are formed on the first surface 800a of the supporting layer 800 exposed by the air gaps AG. Furthermore, a portion of the adhesion layer 902 is removed to expose the second surface 100b of the first redistribution structure 102 before the structured illustrated in FIG. 1G is attached onto the adhesion layer 902. As mentioned above, the signal transmitted in the first conductive patterns 104 may be electrically coupled to the conductive patches 1010. Therefore, the properties of the medium between the first conductive patterns 104 and the conductive patches 1010 are crucial. In general, mediums having low Dk and Df are able to provide low loss transmission path. Since air has low Dk and Df values, the air gaps AG located between the first conductive patterns 104 and the conductive patches 1010 are able to provide a low loss signal transmission path, thereby allowing higher gain of the patch antenna. As a result, the antenna efficiency of the InFO package 50 may be sufficiently enhanced.

Figure 7:
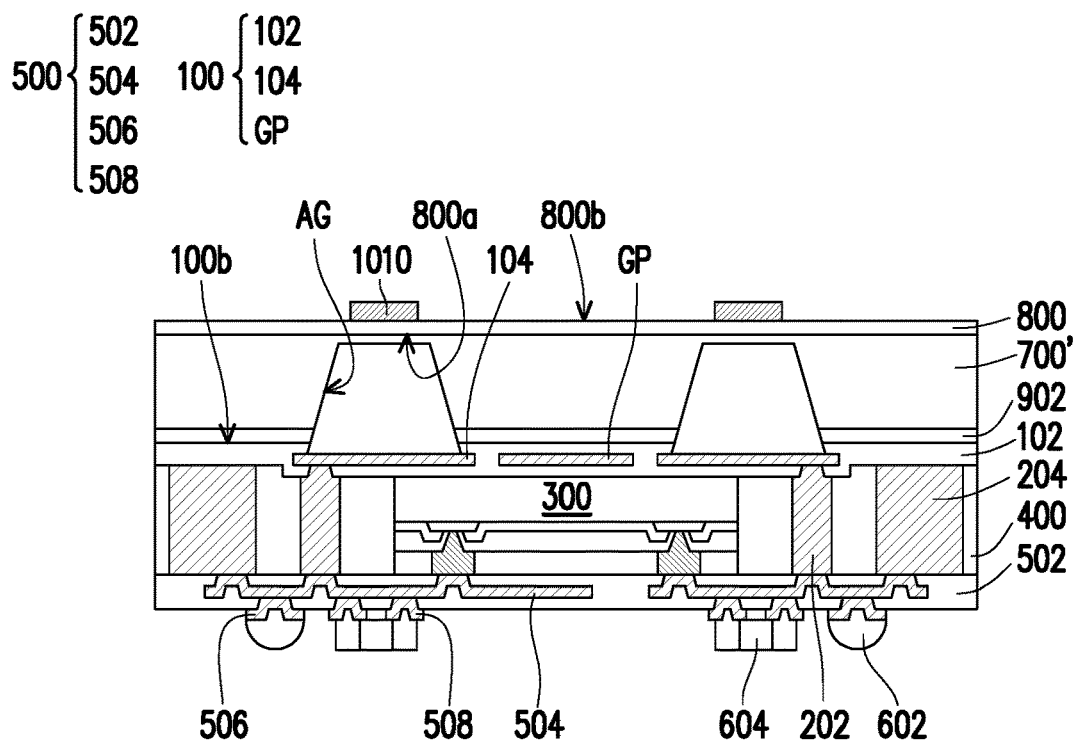
FIG. 7 is a schematic cross-sectional view illustrating an InFO package in accordance with some alternative embodiments of the disclosure.

FIG. 7 is a schematic cross-sectional view illustrating an InFO package 60 in accordance with some alternative embodiments of the disclosure. Referring to FIG. 7, the InFO package 60 illustrated in FIG. 7 may be manufactured by the steps similar to the steps illustrated in FIG. 1A to FIG. 1J. Nevertheless, during the step illustrated in FIG. 1G, the insulating material layer 700 is partially removed in the thickness direction of the insulating material layer 700 such that the air gaps AG do not penetrate through the insulating layer 700'. In other words, after the air gaps AG are formed, the first surface 800a of the supporting layer 800 is still well covered by the insulating layer 700'. Furthermore, during the step illustrated in FIG. 1H, the first dielectric layer 102 of the first redistribution structure 100 and the adhesion layer 902 are partially removed before the structure illustrated in FIG. 1G (i.e. the supporting layer 800 having the insulating layer 700' formed thereon) is attached to the adhesion layer 902. For example, the adhesion layer 902 and the first dielectric layer 102 may be partially removed such that the first conductive patterns 104 of the first redistribution structure 100 are partially exposed to the air. In some embodiments, the portion of the adhesion layer 902 and the portion of the first dielectric layer 102 may be removed through a laser drilling process, a photolithography and etching process, or a punching process. Thereafter, the structure illustrated in FIG. 1G is flipped and is attached onto the adhesion layer 902. In some embodiments, the air gaps AG are aligned with the exposed portion of the first conductive patterns 104. As a result, the air gaps AG are located directly above the first conductive patterns 104 and are directly in contact with the first conductive patterns 104. In other words, as illustrated in FIG. 7, the first conductive patterns 104 are exposed to the air within the air gaps AG. As mentioned above, the signal transmitted in the first conductive patterns 104 may be electrically coupled to the conductive patches 1010. Therefore, the properties of the medium between the first conductive patterns 104 and the conductive patches 1010 are crucial. In general, mediums having low Dk and Df are able to provide low loss transmission path. Since air has low Dk and Df values, by exposing the first conductive patterns 104 to the air within the air gaps AG, the air gaps AG located between the first conductive patterns 104 and the conductive patches 1010 are able to provide a low loss signal transmission path, thereby allowing higher gain of the patch antenna. As a result, the antenna efficiency of the InFO package 60 may be sufficiently enhanced.

Figure 8:
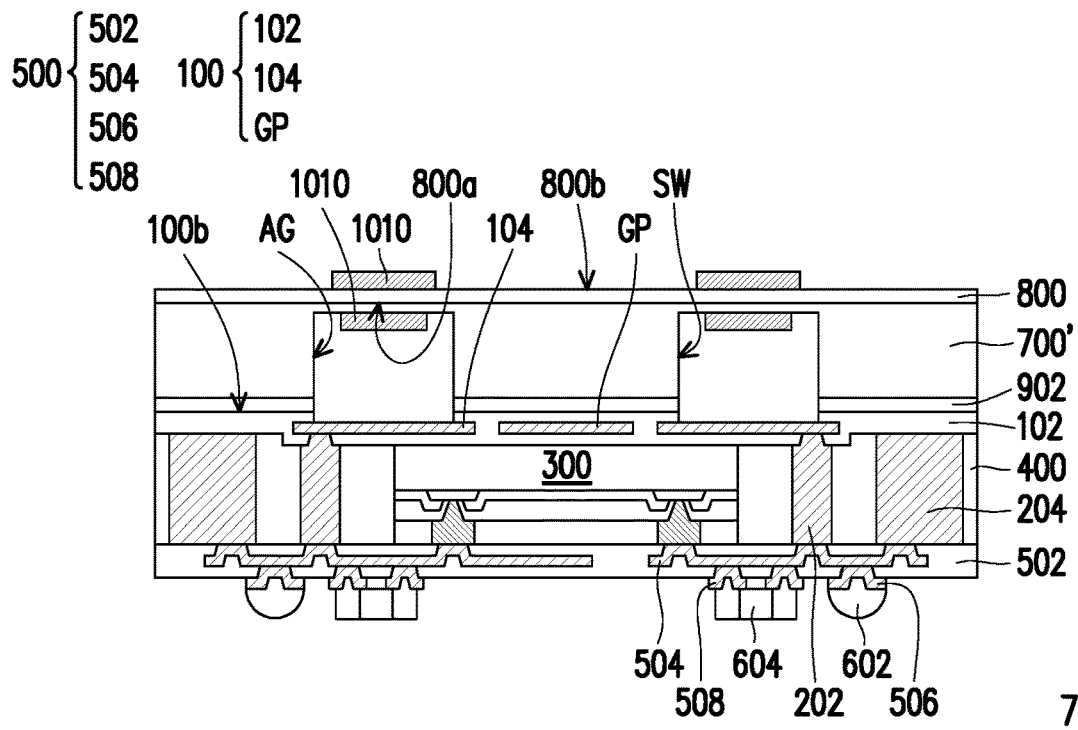
FIG. 8 is a schematic cross-sectional view illustrating an InFO package in accordance with some alternative embodiments of the disclosure.

FIG. 8 is a schematic cross-sectional view illustrating an InFO package 70 in accordance with some alternative embodiments of the disclosure. Referring to FIG. 8, the InFO package 70 illustrated in FIG. 8 may be manufactured by the steps similar to the steps illustrated in FIG. 1A to FIG. 1J. Nevertheless, during the step illustrated in FIG. 1G, the insulating material layer 700 is partially removed in the thickness direction of the insulating material layer 700 such that the air gaps AG do not penetrate through the insulating layer 700'. In other words, after the air gaps AG are formed, the first surface 800a of the supporting layer 800 is still well covered by the insulating layer 700'. In addition, the air gaps AG may be formed to have straight sidewalls SW. Moreover, after the air gaps AG are formed, a plurality of conductive patches 1010 are formed within the air gaps AG. Furthermore, during the step illustrated in FIG. 1H, the first dielectric layer 102 of the first redistribution structure 100 and the adhesion layer 902 are partially removed before the structure illustrated in FIG. 1G (i.e. the supporting layer 800 having the insulating layer 700' formed thereon) is attached to the adhesion layer 902. For example, the adhesion layer 902 and the first dielectric layer 102 may be partially removed such that the first conductive patterns 104 of the first redistribution structure 100 are partially exposed to the air. In some embodiments, the portion of the adhesion layer 902 and the portion of the first dielectric layer 102 may be removed through a laser drilling process, a photolithography and etching process, or a punching process. Thereafter, the structure illustrated in FIG. 1G is flipped and is attached onto the adhesion layer 902. In some embodiments, the air gaps AG are aligned with the exposed portion of the first conductive patterns 104. As a result, the air gaps AG are located directly above the first conductive patterns 104 and are directly in contact with the first conductive patterns 104. In other words, as illustrated in FIG. 8, the first conductive patterns 104 are exposed to the air within the air gaps AG. As mentioned above, the signal transmitted in the first conductive patterns 104 may be electrically coupled to the conductive patches 1010. Therefore, the properties of the medium between the first conductive patterns 104 and the conductive patches 1010 are crucial. In general, mediums having low Dk and Df are able to provide low loss transmission path. Since air has low Dk and Df values, by exposing the first conductive patterns 104 to the air within the air gaps AG, the air gaps AG located between the first conductive patterns 104 and the conductive patches 1010 are able to provide a low loss signal transmission path, thereby allowing higher gain of the patch antenna. As a result, the antenna efficiency of the InFO package 70 may be sufficiently enhanced.

In accordance with some embodiments of the disclosure, an integrated fan-out (InFO) package includes a first redistribution structure, a die, an encapsulant, a plurality of first through interlayer vias (TIV), a second redistribution structure, an insulating layer, a supporting layer, and a plurality of conductive patches. The die is disposed on the first redistribution structure. The encapsulant encapsulates the die. The first TIVs are embedded in the encapsulant. The second redistribution structure is disposed on the die, the first TIVs, and the encapsulant. The first redistribution structure is electrically connected to the second redistribution structure through the first TIVs. The insulating layer is disposed on the first redistribution structure opposite to the die. The insulating layer includes a plurality of air gaps. The supporting layer is over the insulating layer. The conductive patches are over the supporting layer. Locations of the conductive patches correspond to locations of the air gaps of the insulating layer.

In accordance with some alternative embodiments of the disclosure, an integrated fan-out (InFO) package includes a die, an encapsulant, a ground plane, a feed line, a redistribution structure, an insulating layer, a supporting layer, and a plurality of conductive patches. The die has an active surface and a rear surface opposite to the active surface. The encapsulant encapsulates the die. The ground plane is over the rear surface of the die. A portion of the feed line is disposed over the rear surface of the die and a portion of the feed line penetrates through the encapsulant. The redistribution structure is disposed on the active surface of the die and is electrically connected to the feed line. The insulating layer is disposed over the feed line opposite to the die. The insulating layer includes at least one air gap. The supporting layer is over the insulating layer. The conductive patches are over the supporting layer. A contour of the at least one air gap surrounds contours of the conductive patches.

In accordance with some embodiments of the disclosure, a method of manufacturing an integrated fan-out (InFO) package includes at least the following steps. A carrier is provided. A first redistribution structure is formed over the carrier. A plurality of first through interlayer vias (TIV) and a die are formed over the first redistribution structure. An encapsulant is formed to encapsulate the die and the first TIVs. A second redistribution structure is formed over the die, the first TIVs, and the encapsulant. An insulating layer and a supporting layer are formed over the first redistribution structure opposite to the die. The insulating layer includes a plurality of air gaps. A plurality of conductive patches are formed over the supporting layer. Locations of the conductive patches correspond to locations of the air gaps of the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out (InFO) package, comprising:
    a first redistribution structure;
    a die disposed on the first redistribution structure;
    an encapsulant encapsulating the die;
    a plurality of first through interlayer vias (TIV) embedded in the encapsulant;
    a second redistribution structure disposed on the die, the plurality of first TIVs, and the encapsulant, wherein the first redistribution structure is electrically connected to the second redistribution structure through the plurality of first TIVs;
    an insulating layer disposed on the first redistribution structure opposite to the die, wherein the insulating layer comprises a plurality of air gaps;
    a supporting layer over the insulating layer; and
    a plurality of conductive patches over the supporting layer, wherein locations of the plurality of conductive patches correspond to locations of the plurality of air gaps of the insulating layer,
    wherein positioning locations of the plurality of conductive patches are overlapped with positioning locations of the plurality of air gaps along a stacking direction of the die and the insulating layer.

2. The InFO package according to claim 1, further comprising an adhesion layer sandwiched between the insulating layer and the first redistribution structure.

3. The InFO package according to claim 1, further comprising a plurality of second TIVs embedded in the encapsulant, wherein the plurality of second TIVs are electrically connected to the second redistribution structure.

4. The InFO package according to claim 1, wherein the plurality of conductive patches are located inside the plurality of air gaps.

5. The InFO package according to claim 1, wherein the plurality of conductive patches are disposed on a surface of the supporting layer opposite to the insulating layer.

6. The InFO package according to claim 1, wherein the plurality of conductive patches are disposed on both sides of the supporting layer.

7. The InFO package according to claim 1, wherein a minimum width of each of the plurality of air gaps is greater than or equal to a maximum width of each of the plurality of conductive patches.

8. The InFO package according to claim 1, wherein a height of each of the plurality of air gaps is substantially equal to a thickness of the insulating layer.

9. The InFO package according to claim 1, wherein a height of each of the plurality of air gaps is smaller than a thickness of the insulating layer.

10. An integrated fan-out (InFO) package, comprising:
a first redistribution structure comprising a ground plane;
a die disposed on the first redistribution structure;
an encapsulant encapsulating the die;
a plurality of first through interlayer vias (TIV) embedded in the encapsulant;
a second redistribution structure disposed on the die, the plurality of first TIVs and the encapsulant, wherein the second redistribution structure is electrically connected to the second redistribution structure through the plurality of first TIVs;
a feed line, electrically connected to the die and the ground plane, wherein the feed line comprises a portion of the first redistribution structure, at least one of the plurality of first TIVs and a portion of the first redistribution structure electrically connected to each other;
an insulating layer disposed on the first redistribution structure opposite to the die, wherein the insulating layer comprises at least one air gap;
a supporting layer over the insulating layer; and
a plurality of conductive patches over the supporting layer and electrically coupled to the ground plane,
wherein positioning locations of the plurality of conductive patches are overlapped with a positioning location of the at least one air gap of the insulating layer along a stacking direction of the die and the insulating layer.

11. The InFO package according to claim 10, wherein the at least one air gap comprises one air gap having a ring shape, and the contours of the plurality of conductive patches are enclosed by an inner edge of the ring-shaped air gap and an outer edge of the ring-shaped air gap.

12. The InFO package according to claim 10, wherein the at least one air gap comprises a plurality of air gaps, and each of the plurality of conductive patches is located within the contour of the corresponding air gap.

13. A method of manufacturing an integrated fan-out (InFO) package, comprising:
providing a carrier;
forming a first redistribution structure over the carrier;
forming a plurality of first through interlayer vias (TIV) and a die over the first redistribution structure;
forming an encapsulant encapsulating the die and the plurality of first TIVs;
forming a second redistribution structure over the die, the plurality of first TIVs, and the encapsulant;
forming an insulating layer and a supporting layer over the first redistribution structure opposite to the die, wherein the insulating layer comprises a plurality of air gaps; and forming a plurality of conductive patches over the supporting layer, wherein locations of the conductive patches are overlapped with locations of the plurality of air gaps of the insulating layer along a stacking direction of the die and the insulating layer.

14. The method according to claim 13, wherein the step of forming the insulating layer and the step of forming the supporting layer comprises:
forming the supporting layer over an insulating material layer;
removing a portion of the insulating material layer, so as to form the insulating layer having the plurality of air gaps; and
attaching the supporting layer and the insulating layer having the plurality of air gaps onto the first redistribution structure.

15. The method according to claim 14, wherein the portion of the insulating material layer is removed such that a portion of the supporting layer is exposed.

16. The method according to claim 15, wherein the step of forming the plurality of conductive patches comprises disposing the plurality of conductive patches over the supporting layer exposed by the plurality of air gaps.

17. The method according to claim 13, wherein the first redistribution structure comprises a first dielectric layer and a plurality of first conductive patterns embedded in the first dielectric layer, and the method further comprises removing a portion of the first dielectric layer to expose at least a portion of the first conductive patterns.

18. The method according to claim 13, wherein the step of forming the insulating layer comprises:
forming an insulating material layer over the first redistribution structure; and
removing a portion of the insulating material layer to expose a portion of the first redistribution layer, so as to form the insulating layer having the plurality of air gaps.

19. The method according to claim 18, furthering comprising forming an adhesion layer over the first redistribution structure prior to the formation of the insulating material layer.

20. The method according to claim 19, further comprising removing a portion of the adhesion layer to expose the first redistribution layer.

* * * * *